US008811694B2

(12) United States Patent
Mendes et al.

(10) Patent No.: US 8,811,694 B2
(45) Date of Patent: Aug. 19, 2014

(54) INTRINSIC DETECTION OF MOTION IN SEGMENTED SEQUENCES

(75) Inventors: Jason K. Mendes, Draper, UT (US);
Dennis L. Parker, Centerville, UT (US)

(73) Assignee: University of Utah Research Foundation, Salt Lake City, UT (US)

( * ) Notice: Subject to any disclaimer, the term of this patent is extended or adjusted under 35 U.S.C. 154(b) by 798 days.

(21) Appl. No.: 12/895,434

(22) Filed: Sep. 30, 2010

(65) Prior Publication Data

US 2012/0082355 A1 Apr. 5, 2012

(51) Int. Cl.
*G06K 9/00* (2006.01)
*G01R 33/565* (2006.01)
*G01R 33/561* (2006.01)

(52) U.S. Cl.
CPC ...... *G01R 33/56509* (2013.01); *G01R 33/5611* (2013.01)
USPC .......................................................... 382/128

(58) Field of Classification Search
None
See application file for complete search history.

(56) References Cited

U.S. PATENT DOCUMENTS

| | | | |
|---|---|---|---|
| 4,936,526 A | 6/1990 | Gries | |
| 5,363,844 A | 11/1994 | Riederer et al. | |
| 6,586,935 B1 | 7/2003 | Ma et al. | |
| 6,771,068 B2 | 8/2004 | Dale et al. | |
| 6,853,191 B1 | 2/2005 | Miller et al. | |
| 6,958,605 B2 | 10/2005 | Dale et al. | |
| 7,348,776 B1 | 3/2008 | Aksoy et al. | |
| 7,358,732 B2 | 4/2008 | Van Der Kouwe et al. | |
| 7,365,543 B2 | 4/2008 | Yui et al. | |
| 7,368,910 B2 | 5/2008 | Bammer et al. | |
| 7,432,706 B2 | 10/2008 | Van Der Kouwe | |
| 7,692,423 B2 | 4/2010 | Cunningham et al. | |
| 8,116,541 B2 * | 2/2012 | Brau et al. | 382/128 |
| 2002/0180436 A1 | 12/2002 | Dale et al. | |
| 2005/0001618 A1 * | 1/2005 | Bydder | 324/307 |
| 2006/0062731 A1 | 3/2006 | Bammer et al. | |
| 2007/0090837 A1 | 4/2007 | Van Der Kouwe et al. | |
| 2007/0223799 A1 * | 9/2007 | Weiss | 382/131 |
| 2007/0238972 A1 | 10/2007 | Nauerth | |
| 2007/0249929 A1 | 10/2007 | Jeong et al. | |
| 2008/0004518 A1 | 1/2008 | Stehning et al. | |
| 2008/0054899 A1 * | 3/2008 | Aksoy et al. | 324/307 |
| 2008/0137930 A1 | 6/2008 | Rosen | |
| 2008/0205730 A1 * | 8/2008 | Stehning et al. | 382/131 |
| 2008/0279433 A1 * | 11/2008 | Brau et al. | 382/131 |
| 2008/0310696 A1 * | 12/2008 | Hwang | 382/131 |
| 2012/0002858 A1 * | 1/2012 | Huang et al. | 382/131 |
| 2012/0082355 A1 * | 4/2012 | Mendes et al. | 382/131 |
| 2012/0201428 A1 * | 8/2012 | Joshi et al. | 382/107 |
| 2012/0243756 A1 * | 9/2012 | Samsonov et al. | 382/131 |

* cited by examiner

*Primary Examiner* — Tahmina Ansari
(74) *Attorney, Agent, or Firm* — Fulbright & Jaworski LLP (57) ABSTRACT

A self-navigating technique designed to detect motion in segmented sequences is disclosed. Certain embodiments compare a plurality of segments containing adjacent sets of k-space lines and produce an aliased error function which corresponds to a correlation of the segments. A global shift of the aliased error function may indicate the presence of in-plane rigid-body translation while other types of motion are evident in the dispersion or breadth of the error function. Some embodiments may then replace motion corrupted data with reacquired data. Further, some embodiments may correct or remove corrupted data retrospectively.

22 Claims, 6 Drawing Sheets

INTRINSIC DETECTION OF MOTION IN SEGMENTED SEQUENCES

GOVERNMENT INTERESTS

This invention was made with government support under Grants HL48223 and HL57990, awarded by the National Institute of Health. The government has certain rights in this invention.

TECHNICAL FIELD

The present disclosure relates generally to medical imaging and, more particularly, to detecting corrupt data caused by undesired motion of a subject.

BACKGROUND OF THE INVENTION

Patient motion is one of the dominant sources of artifact in Magnetic Resonance Imaging (MRI) images. MRI techniques generally involve capturing data measurements (sometimes referred to k-space measurements) for a sequence of slices over a period of time. During the capture stage, movement of a subject may cause a particular slice to become corrupted. While many motion correction techniques for MRI have been proposed, their use is often limited by the need for increased patient preparation, decreased patient comfort, additional scan time, or the use of specialized sequences not available on many commercial scanners. Techniques developed to detect and correct motion include those that utilize specialized hardware to detect patient motion, those that utilize special k-space trajectories with some inherent motion correction ability, those that acquire additional navigator data for the purpose of motion correction, and those considered to be self-navigating.

Motion detection techniques that rely on specialized hardware may include utilizing laser beams which reflect light off of specialized markers. Optical or infrared tracking systems which use multiple cameras or sensors may also be implemented. Other methods may implement tracking using small receiver coils configured to detect motion changes or by using spatial-frequency tuned markers.

Techniques that use specialized k-space trajectories for motion detection may include acquiring rotated sets of overlapping parallel lines or interleaving spiral trajectories. Other methods may include acquiring data in some sort of hybrid Radial-Cartesian fashion or using alternating frequency/phase encode directions.

Some motion detection techniques acquire additional navigator data as a Cartesian projection in the absence of either phase or frequency encoding or with a floating navigator. Orbital navigators utilize a circular k-space trajectory to detect object motion while spherical navigators sample spherical k-space shells. When multiple receive coils are used, parallel imaging techniques such as SENSE or GRAPPA can use a subset of acquired data to predict other measurements that may or may not already be acquired. These predicted k-space lines are compared to the same k-space lines that are actually acquired. Both of these parallel imaging methods require the acquisition of additional calibration data, thus increasing scan time. While all of these motion detection techniques have shown success in their respective applications, their use is often limited by one or more of the following: increased complexity in patient preparation, decreased patient comfort, additional scan time or the required use of specialized sequences not available on many commercial scanners.

Several proposed self-navigating techniques address a specific type of motion (typically in-plane and rigid-body) but none address both rigid and non-rigid body motion that can occur both in and out of plane. For example, motion in the readout direction has been detected by taking the Fourier Transform of a line of acquired data and trying to determine the edges of the object's profile. The edges become increasingly difficult to determine from lines encoded near the edges of k-space and high contrast markers are often added to the patient to overcome this problem. Motion in the phase encode direction can be detected using a symmetric density constraint along the phase encoding axis. However, the algorithm is restrictive on the object type and may not perform well for large motion in the phase encode direction. Another approach is to apply a spatial constraint to the object and then use an iterative phase retrieval algorithm to calculate the desired phase of the object. The calculated phase is compared to the measured phase to simultaneously find motion in the readout and phase encode directions. The algorithm performs well for sub-pixel motions but is unable to correct an artifact caused by large translations. Combinations of these self navigating methods have also been proposed to overcome some of their pitfalls, but have not proven to be robust in the presence of out-of-plane or non-rigid body motion.

Motion may also be determined by iteratively minimizing the entropy of motion-induced ghosts and blurring in an otherwise dark region of an image. Alternatively, data correlations between adjacent data lines can provide information about in-plane rigid body translation. Radial sequences can provide a self-navigating method for rigid-body motion correction using moments of spatial projections or the phase properties of radial trajectories. Motion correction in the slice direction has also been explored by monitoring amplitude modulations of the acquired data. A combination of some of these proposed techniques can be utilized to correct for in-plane rigid-body motion but does not include the ability to address other types of motion.

SUMMARY

The present application is directed to systems and methods which compensate for undesired motion utilizing an aliased error function derived using a plurality of data segments. In certain embodiments, the error function may be employed to recognize corrupted data and reacquire the portions of data which correspond to the area of the corrupted data. Further, embodiments may remove corrupted data retrospectively. In some embodiments, data that is corrupted by out-of-plane and/or non-rigid body motion is detected and compensated for during image reconstruction. Such utilization of an error function, and corresponding capabilities resulting therefrom, represents significant advances over prior compensation techniques.

Certain embodiments of the present application provide for a self-navigating technique designed to detect and compensate for undesired motion observed in segmented sequences. For example, in some embodiments, two segments containing adjacent sets of k-space lines are compared and an aliased error function is produced which corresponds to a correlation of the two segments. In some embodiments, a global shift of the aliased error function may be observed and seen as indicative of the presence of other types of motion. Such shifts may be evident in the dispersion or breadth of the error function.

While the concepts described herein may be employed for any imaging application, some embodiments may be particularly useful for detecting and compensating for errors observed during carotid imaging applications, such as detecting errors due to swallowing or head nodding. Certain embodiments may be implemented using existing legacy imaging systems which are adapted to utilize the methods described herein.

According to one embodiment, an imaging system may be provided which comprises a processing device configured to receive raw image data. The processing device may be configured to analyze correlation factors between a plurality of image scans and calculate an error function corresponding to the correlation of the plurality of image scans, e.g., comparing a subset of k-space lines to another sub-set, or comparing an image frame to another image frame. The processing device may be further configured to output a control signal to a transducer device which instructs the transducer to reacquire a particular image scan of the plurality of image scans in the event that the error function indicates that corrupt data has been received. Alternatively, other corrective or compensating measure may be triggered in response to the detection of corrupted data. For example, the processor may implement parallel imaging or constrained reconstruction techniques in response to particular properties of the error function.

An additional embodiment provides for a self-navigating method to compensate for motion of a subject being imaged. The method includes receiving image acquisition data and analyzing correlation information of the image acquisition data between a plurality of points in k-space. The method further includes calculating an error function corresponding to the correlation information and determining whether new acquisition data is needed for a particular point in k-space. If new acquisition data is needed, embodiments may be configured to receive new acquisition data for the particular point in k-space and reconstruct an image using the new acquisition data.

A further embodiment provides a computer program product having a computer readable media including instructions encoded thereon. When the instructions are executed, the computer program product may cause a device to receive image data which has a plurality of sequences, wherein at least one of the sequences are corrupted by motion of a subject being imaged. With the received sequences, the program may analyze a correlation between the at least one corrupted sequence and an adjacent sequence of the plurality of sequences and calculate an error function corresponding to the correlation. Based on the error function, the program may detect/identify the corrupted sequence. In certain embodiments, the program may (e.g., in response to the detection of the corrupted sequence) also acquire additional sequence data to replace the corrupted sequence in order to generate a reconstructed image.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawings, in which.

DETAILED DESCRIPTION

In portions of the following description, embodiments are illustrated in terms of a carotid imaging application. It is noted that the inventive aspects discussed herein are not limited in application to carotid imaging, but may likewise be used in many imaging applications. For example, the present methods may be used in brain or extremity imaging. Imaging implementations may be implemented anywhere on a subject where motion occurs occasionally and over brief intervals. Further, inventive aspects discussed herein may be used when imaging any type of subjects (e.g., humans, animals, machines, devices, etc.), and while monitoring any form of undesired movement therein. The specific examples are utilized for descriptive purposes only and are not intended to be limiting. Alterations and further modifications of the inventive features illustrated herein, and additional applications of the principles of the inventions as illustrated herein, which would occur to one skilled in the relevant art and having possession of this disclosure, are to be considered within the scope of the invention.

Figure 1:
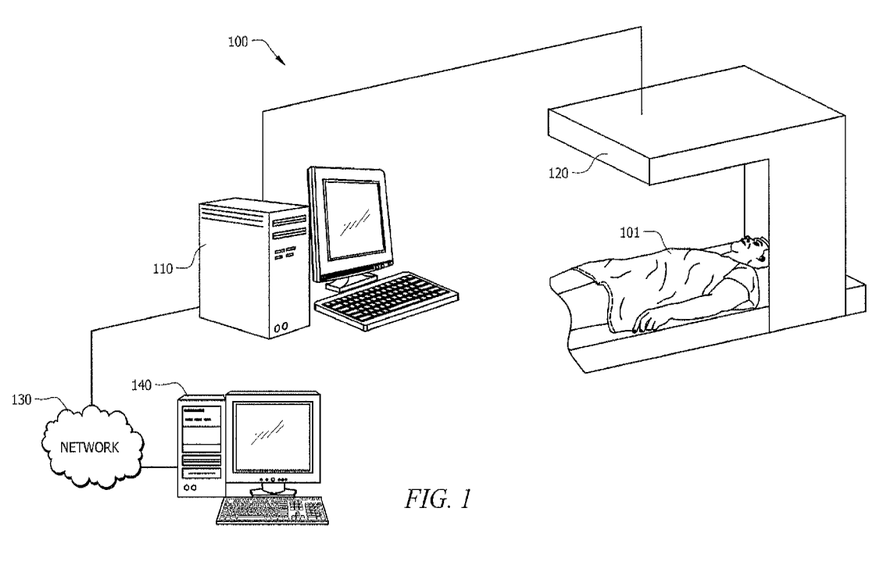
FIG. 1 illustrates an imaging system in accordance with an embodiment of the present application.

Directing attention to FIG. 1, an imaging system adapted according to an embodiment of the present invention is shown as imaging system 100. Imaging system 100 comprises processor based system 110 operatively coupled to transducer 120 for use in collecting imaging data with respect to subject 101. For example, subject 101 may comprise a patient for which imaging of a portion of the patient's body (e.g., head, torso, leg, shoulder, etc.) is desired. Such imaging as provided by imaging system 100 may comprise reconstruction of images of internal body structure (e.g., organs, cavities, bones, etc.) using one or more imaging modalities (e.g., computed tomography (CT), magnetic resonance imaging (MRI), positron emission tomography (PET), etc.).

Processor based system 110 of certain embodiments comprises a processor (e.g., central processing unit (CPU), application specific integrated circuit (ASIC), etc.), memory (e.g., random access memory (RAM), read only memory (ROM), disk memory, optical memory, etc.), and appropriate input/output (I/O) apparatus (e.g., display, pointing device, keyboard, printer, speaker, microphone, etc.) operable under control of an instruction set (e.g., software, firmware, etc.) defining operation as described herein. Such operation may provide image reconstruction using one or more imaging modality corresponding to the configuration of transducer 120. For example, where a CT imaging modality is utilized transducer 120 may comprise an X-ray source and detector configuration, where a MR imaging modality is utilized transducer 120 may comprise a magnetic field generator and receiver configuration, and where a PET imaging modality is utilized, transducer 120 may comprise a gamma ray source and detector configuration.

In some embodiments, processor based system 110 functions to control the hardware for data acquisition at transducer 120. Further, in these embodiments the acquired data is sent through network medium 130 to secondary processing system 140 where reconstruction takes place. In these embodiments the secondary processing system 140 may recognize corrupt data and send a signal to processor based system 110 to reacquire portions of information. In other embodiments, processor-based system 110 controls both transducer 120 and implements all reconstruction processing and detection of corrupt data.

Figure 2:
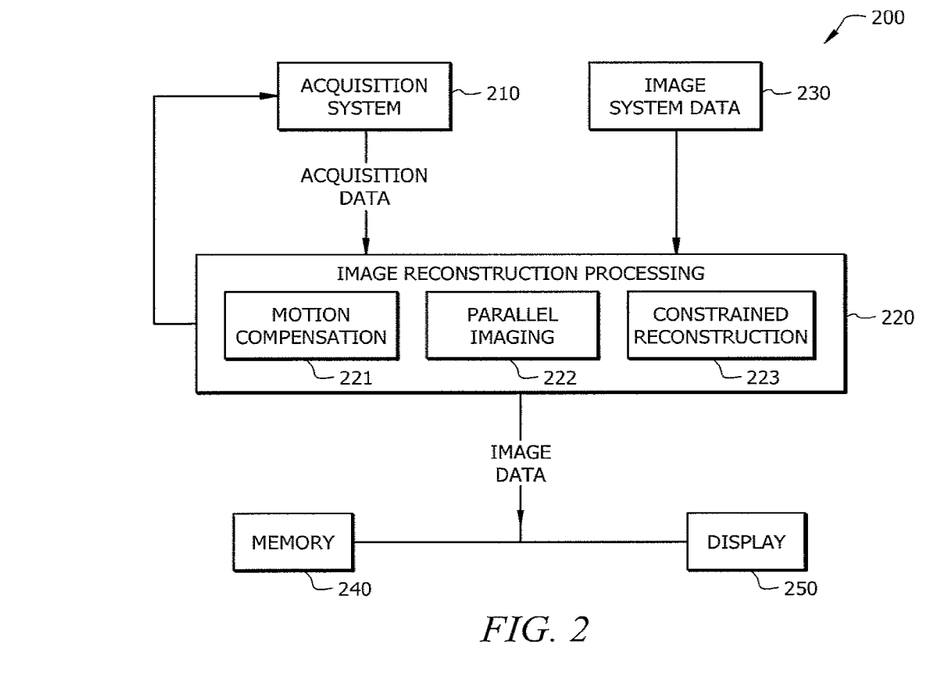
FIG. 2 illustrates an image reconstruction framework in accordance with an embodiment of the present application.

Imaging system 100 of certain embodiments herein is adapted to utilize an image reconstruction framework to compensate for motion of a subject, such as non-rigid body or out-of-plane motion, in an image reconstruction technique implemented thereby. An image reconstruction framework, as may be utilized by imaging system 100, is shown in FIG. 2 as image reconstruction framework 200. Image reconstruction framework 200 may be implemented in whole, or in part, as instructions operable upon the processor of processor based system 110 and/or secondary processing system 140 of imaging system 100.

According to embodiments of the invention, image reconstruction framework 200 utilizes captured raw imaging data information of a particular imaging modality and implements processing methods to compensate for corrupted data, e.g., or motion of a subject being imaged. Accordingly, image reconstruction framework 200 of the illustrated embodiment includes an acquisition system 210, which functions to acquire imaging data, and image reconstruction processing module 220, which provides 2D and/or 3D image reconstruction processing. Acquisition system 210 may be embodied as imaging system 100, or a portion thereof, as discussed above. Acquisition data is sent to image reconstruction processing module 220. Further, other parameters useful to image construction processing may be provided to image reconstruction processing module 220 by acquisition system 210 or image system data module 230. Such additional parameters may include information regarding the modality of data being received by acquisition system 210, information regarding acquisition system 210 such as coil sensitivities and the like, additional sensor information related to the subject being imaged (pressure sensor data, vital statistic data, etc.), reference values related to patients or to a particular diagnostic procedure for signal processing, etc.

Image reconstruction processing module 220 comprises motion compensation block 221. Motion compensation block 221 functions to receive acquisition data and to determine whether motion compensation processes should be undertaken, whether additional acquisition scans are and/or other compensation actions should be triggered for a particular location or portion of raw image data of a subject being imaged, and whether other processing blocks such as parallel imaging block 222 or constrained reconstruction block 223 should be utilized to compensate for motion. In accordance with some embodiments described, motion compensation block 221 may be configured to compensate for both out-of-plane and non-rigid body motion. Once image reconstruction processing module 220 has completed its processing, image reconstruction processing module 220 outputs reconstructed image data. Such image data may be stored by a memory device 240 which is either internal or external to image reconstruction framework 200, and/or the image data may be output to display device 250.

Figure 3:
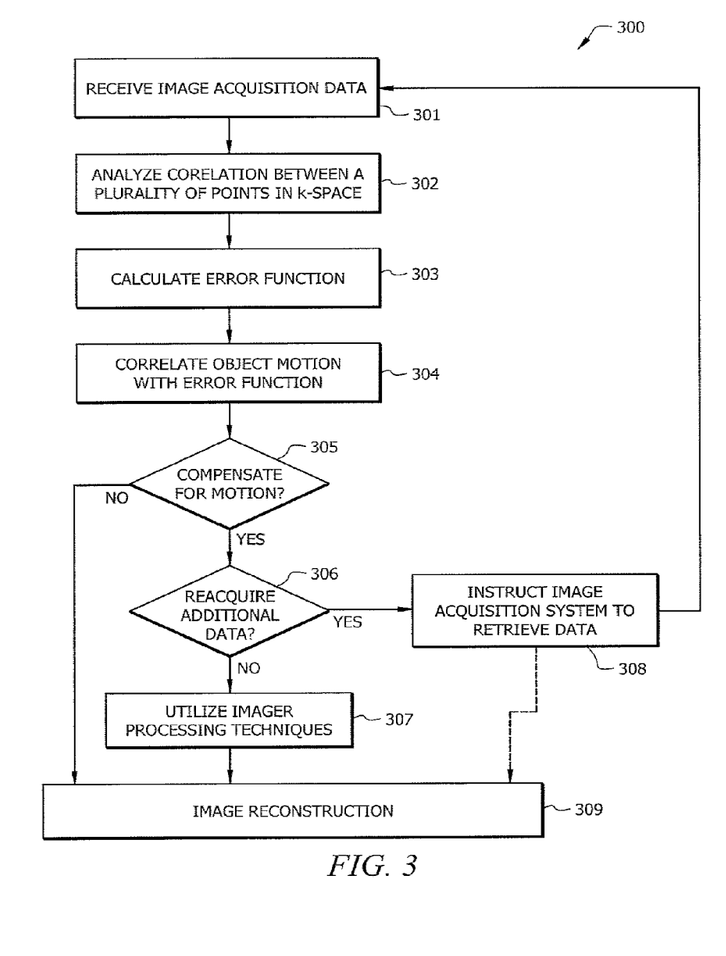
FIG. 3 illustrates a flow diagram for motion a compensation method in accordance with an embodiment of the present invention.

FIG. 3 illustrates a flow diagram for a motion compensation method 300 in accordance with an embodiment of the present invention. In certain embodiments, the functionality of method 300 may be implemented entirely by, or as part of, image reconstruction framework 200, such as by image reconstruction processing module 220. Accordingly, method 300 will be described in the context of image reconstruction framework 200 of FIG. 2. It is noted that application of this method is not limited to use within such framework but may likewise be adapted for implementation within other system framework or architecture.

Image acquisition data (e.g., captured by acquisition system 210) may be received at 301 by image reconstruction processing module 220 and sent to motion compensation block 221. Motion compensation block 221 functions to analyze correlation between a plurality of points in k-space in operation 302. Such points may be adjacent, directly in sequence, or may be selected in accordance with other predetermined considerations which may select points that will be known to have some expected correlation. In some embodiments, two points of k-space are sufficient for analysis, while other embodiments may utilize additional points.

Motion compensation block 221 may then function to calculate the error function between the analyzed points of k-space in operation 303. Examples of methods for error function calculation are discussed in detail below. With the error function data, the method correlates the object motion, such as in-plane rigid body, with the error function in operation 304.

Some embodiments may determine whether motion compensation should be rendered 305 by motion compensation block 221. Such compensation may require additional data 306 to be acquired from acquisition system 210. In some embodiments the error function may be minimal and no further compensation is undertaken. In other embodiments, errors may be compensated for by utilizing additional processing techniques at operation 307. For example, these processing techniques may include parallel imaging or constrained reconstruction techniques which may be implemented by parallel imaging block 222 or constrained reconstruction block 223, respectively. It is noted that these additional processing techniques may also be implemented within image reconstruction block 309.

In parallel imaging techniques, a reduced data set in the phase encoding direction(s) of k-space is acquired to shorten acquisition time, combining the signal of several coil arrays on a transducer. The spatial information related to the phased array coil elements is utilized for filling in missing information corresponding to empty bins. Temporally constrained reconstruction techniques apply an a priori constraint that assumes that the object is not going to change very rapidly from one image bin to the next image bin. With the assumption that the changes in a given image will be relatively small with respect to a previous image, an iterative algorithm may be utilized that uses the data measured, along with these constraints, and converges on the set of images that satisfy the constraints and satisfy the measured data. Any method, such as discussed above, which is able to compensate for a perceived error function may be utilized separately, or in combination at block 307 in order to yield a satisfactory result.

In some circumstances the error function will connote that the acquired data will have greater than acceptable impact on the reconstructed image. In such cases, some embodiments may utilize motion compensation block 221 to instruct image acquisition system 210 to retrieve further data for the particular portions of k-space being analyzed at block 308. With the newly acquired data, embodiments may repeat the analysis and error function calculations or the new data may be sent directly to image reconstruction block 309.

Image reconstruction block 309 will then function to output reconstructed image data. As part of image reconstruction block 309, certain embodiments may compensate for parameters of the acquisition system. In such an event, these embodiments may compensate for various acquisition system parameters. For example, image data or signal intensity may be effected by parameters of an acquisition system such as the coil sensitivity profile of an MRI device. To compensate for this, some embodiments may convolve the received image data with a Fourier transform of the receive coil's sensitivity profile.

In some embodiments of the present invention function data is detected that is corrupted by out-of-plane or non-rigid body motion. Certain embodiments may utilize the fact that two adjacent points in k-space will typically show some degree of correlation. This correlation can occur when the object being imaged does not fill the entire Field of View (FOV) or when the object's signal intensity is modified by the receive coil's sensitivity profile. In the latter case, the k-space data may be convolved with the Fourier transform of the receive coil's sensitivity profile which introduces correlations between data points.

These data correlations can be exploited with a proposed self-navigating technique to detect various types of object motion. Consider an image acquisition that is divided into $N_{Seg}$ segments that each sample a set of equally spaced k-space lines with a sampling function:

$$S_L(k_x, k_y) = \sum_{j=0}^{N_{Line}-1} \delta(k_y - (L + jN_{Seg})\Delta k_y) \quad [1]$$

where L is the current segment, $N_{Line}$ is the number of lines sampled per segment and $\Delta k_y$ is the distance between adjacent phase encode lines in the sampled k-space. The number of lines per segment is kept small enough that the object can be assumed to be approximately stationary during the acquisition of a single segment. Now consider the correlation of two adjacent data segments. Since each segment samples a different set of k-space lines, to compare the $L^{th}$ and the $(L+1)^{th}$ segments, the k-space data of the $(L+1)^{th}$ segment is shifted by $\Delta k_y$. A weighted cross correlation is then taken as:

$$C_L(k_x, k_y, t) = \frac{F_L(k_x, k_y, t) F_{L+1}^*(k_x, k_y + \Delta k_y, t + \Delta t)}{|F_L(k_x, k_y, t)| \cdot |F_{L+1}(k_x, k_y + \Delta k_y, t + \Delta t)|} \quad [2]$$

where $F_L(k_x, k_y, t)$ is the Fourier transform of the object's image weighted by the sampling function $S_L(k_x, k_y)$ given in Equation [1]. The phase of the weighted cross correlation function is separated into a linear term, representing rigid-body translation, and a non-linear term for motion not classified as rigid-body translation. The cross correlation function with the new phase separation is:

$$C_L(k_x, k_y, t) = e^{i[k_x dx(t) + k_y dy(t)]} e^{i\phi(k_x, k_y, t)} S_L(k_x, k_y) \quad [3]$$

where $\phi(k_x, k_y, t)$ is the non-linear portion of the phase and dx(t) and dy(t) quantify the rigid-body translation between the acquisition at time t and the acquisition at $t+\Delta t$. If an error function is defined as:

$$\epsilon(x, y, t) = \Im[e^{i\phi(k_x, k_y, t)}] \quad [4]$$

then the weighted cross correlation in image space is similar to the previously published result, except it is modified by the error function as:

$$c_L(x, y, t) = \quad [5]$$
$$N_{Line} \sum_{j=0}^{N_{Seg}-1} e^{i\pi\left(\frac{2L}{N_{Seg}} + N_{Line} - 1\right)j} \epsilon[x - dx(t), y - dy(t) - jN_{Line}\Delta y, t]$$

where $\Delta y$ is the image space voxel size in the phase encoding direction. The basic result is an aliased set of error functions defined by Equation [4] that are collectively shifted proportionally to the object's rigid-body translation. The error function $\epsilon(x,y,t)$ is a measure of data correlation between the $L^{th}$ and $L+1^{th}$ data segments. If there are enough echoes in the echo train, the aliased copies of $\epsilon(x,y,t)$ will be spaced far enough apart for one to characterize the general shape of the error function. With this information, object motion can be correlated with the error function dispersion (a measure of how peaked or spread out the error function is).

The following description of FIGS. 4-7 describe example implementations and results of embodiments of the present invention. The specific methods used in this example are described for illustrative purposes only to facilitate one of ordinary skill in the art in understanding the concepts described herein, and are not intended to limit the scope of the concepts. All data sets were obtained on a Siemens Trio 3T MRI scanner.

Turbo Spin Echo (TSE) 2D axial neck images were obtained from two subjects using a 2 element surface coil (one anterior and one posterior coil) and a third subject using a 4 element surface coil. Data from the first subject (FIG. 4B) was acquired with 256×252 pixels, a resolution of 0.8 mm×0.8 mm×5 mm, TR=1.5 s, TE=6.8 ms and 7 echoes per echo train. Data from the second subject (FIGS. 4, 5B and 6) was acquired with 512×512 pixels, a resolution of 0.35 mm×0.35 mm×5 mm, TR=1.5 s, TE=8.6 ms and 16 echoes per echo train.

For the third subject (FIG. 7), reacquiring data prospectively was simulated by acquiring two complete data averages; the first data average is acquired with subject motion while the second data average is acquired with no motion. Once the corrupt data segments are identified in the first average, they are replaced with data from the second average. This replaced data is similar to what would have been received if the data was reacquired. The data from the third subject was acquired with a resolution of 0.6 mm×0.6 mm×2 mm, 12 echoes per segment, 2 averages, 22 segments to fill k-space and a TRITE of 2.5 s/61 ms.

To measure the dispersion of the error function, embodiments may determine rigid-body translation (dx(t) and dy(t) in Equation [5] by measuring the offset of the correlation function from the origin. The dispersion of the error function may then be measured with a weighted summation such that pixels far from the error function's origin (expected to increase with error function broadening) contribute more significantly to the total summation. While several weighting schemes have been tested, a simple linear weighting has been used to obtain robust results. Additionally, since the maximum value of $c_L(x,y,t)$ varies depending on which two data segments are compared, $c_L(x,y,t)$ can be normalized to unity prior to measuring dispersion. In this case, the error function is estimated as:

$$D_L(t) = \frac{\sum_{x=-n}^{n}\sum_{y=-n}^{n} |c_L(x - dx(t), y - dy(t), t)| \cdot x \cdot y}{\max_{x,y} |c_L(x, y, t)|} \quad [6]$$

where $n=\text{ceil}(0.5*N_{Line}*\Delta y)$ selects the central copy of the aliased error function which repeats every $N_{Line}\Delta y$ pixels. When data is analyzed from multiple receive channels, dispersion may be calculated for each channel independently and the results averaged. If there are just a few corrupt data segments then the standard deviation of the dispersion will be low and any segments with a dispersion more than one or two standard deviations from the mean may be identified as corrupt.

Since the error function in Equation [5] is aliased and two dimensional, embodiments may only display the central portion of a profile through the origin of the error function (in the phase encode direction). While showing just a profile of a two dimensional error function does not yield a complete picture, in some embodiments it may be sufficient for display purposes to show a trend or general concept. The actual motion detection is based on the dispersion of the error function (Equation [6]) and can consider the two dimensional error function rather than the profiles shown in the figures.

Figure 4:
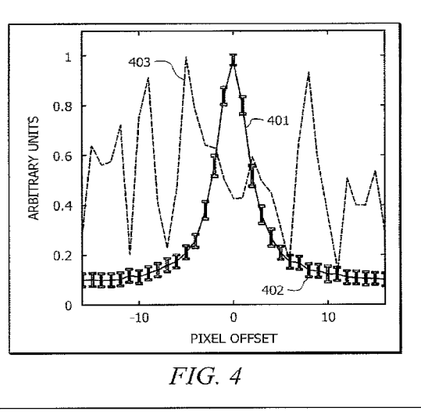
FIG. 4 illustrates an average error function profile for a subject who has swallowed during a neck scan in accordance with an embodiment of the present invention.

FIG. 4 illustrates an average error function profile for a subject who has swallowed during an axial 2D TSE neck scan in accordance with an embodiment of the present invention. The data set contains 32 segments with one segment corrupted when the subject swallowed. The solid line 401 shows the average error function profile found from comparing all adjacent data segments except the ones including the corrupt data segment. The deviation of the error function profiles are shown by the error bars 402 on the solid line. For comparison, dashed line 403 in FIG. 4 shows the magnitude of the error function changes when motion corruption, swallowing in this case, is present.

Figure 5A:
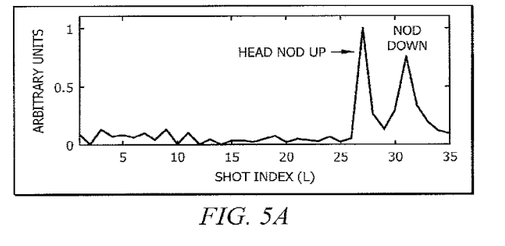
FIG. 5 illustrates a result error function plot of two subject studies in accordance with an embodiment of the present invention.
Figure 5B:
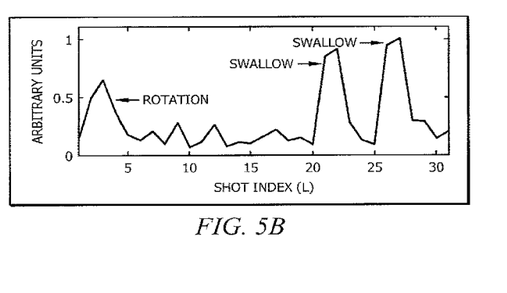

FIG. 5 illustrates a result error function plot of two subject studies in accordance with an embodiment of the present invention. A subject was asked to lie still during the first part of the scan and then to nod their head down, hold it for a few seconds, and then return their head to the original position. The dispersion of the error function, as measured with Equation [6], is shown in FIG. 5A. In the second study, the subject was asked to slightly rotate their head for a second (about one degree), return to the original position, and then swallow several times near the end of the scan (FIG. 5B). All instances of the motion are clearly discernable when considering the dispersion of the error function.

Figure 6A:
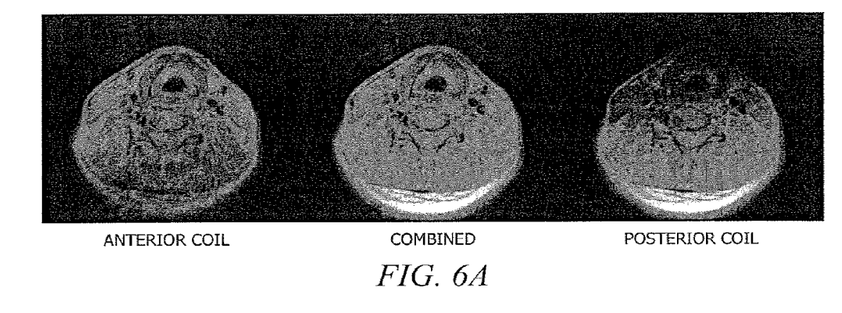
FIG. 6 illustrates effects of varying sensitivities of a two element coil in accordance with an embodiment of the present invention.
Figure 6B:
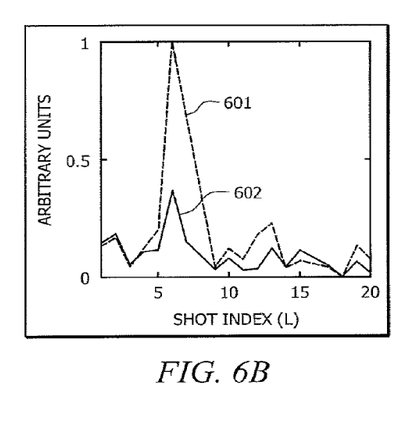
Figure 6C:
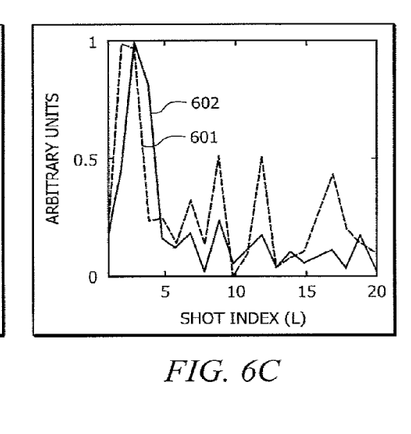

It is noted that the signals received which are used to detect object motion may also dependent on the sensitivity profile of the coil element being considered. FIG. 6 illustrates effects of varying sensitivities of a two element coil in accordance with an embodiment of the present invention. While both elements were almost equally sensitive to the subject rotating their neck as shown in FIG. 6C, the anterior element 601 was more sensitive to subject swallowing than the posterior element 602 in FIG. 6B.

Figure 7A:
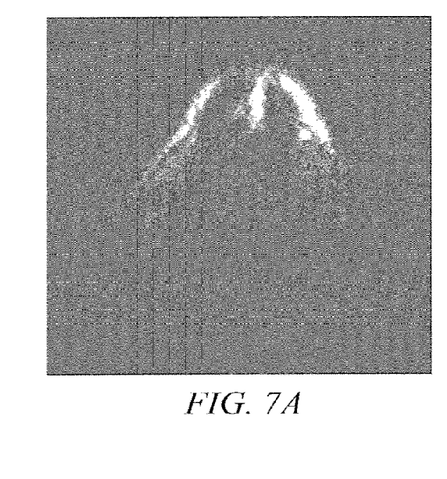
FIG. 7 illustrates results of an application of a self-navigating correction technique in accordance with an embodiment of the present invention.
Figure 7B:
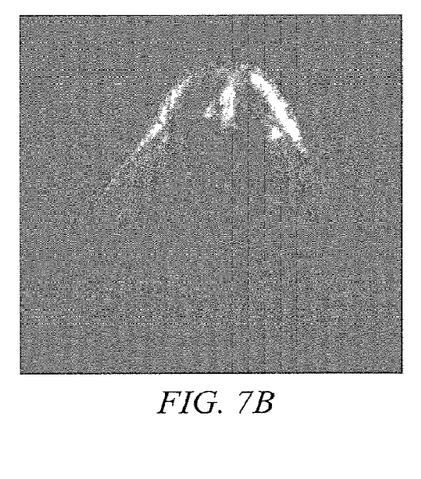
Figure 7C:
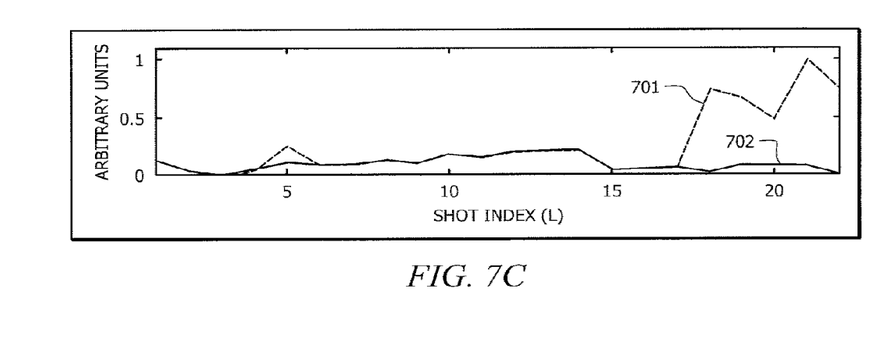

With the error function data, embodiments of the proposed self-navigating correction technique is applied to a subject neck study as shown in FIG. 7. The motion corrupted image is shown in FIG. 4A with the corrected image shown in FIG. 7B. Several corrupt data segments appear in the original error function dispersion 701 of FIG. 7C. Once these corrupt data segments are replaced with reacquired data, the error function dispersion no longer shows the presence of the corrupted data segments at 702 in FIG. 7C.

Accordingly, rigid-body translation can be detected and compensated using the correlation of adjacent data segments. Embodiments of the present invention further detect data measurements corrupted by other types of motion such as out-of-plane or non-rigid body motions caused, for example, by swallowing or head movement. When such data is detected, motion corrupted measurements may be reacquired or eliminated during reconstruction. This error function-based motion detection method may implemented with the assistance of two assumptions: First, in the absence of motion, the error function obtained from the correlation of any two adjacent data segments remains strongly peaked near the origin. Second, when motion not classified as non-rigid-body translation occurs, the error function becomes spread or dispersed with a greatly diminished or missing peak.

It is noted that a combination of rigid-body translation with other types of object motion (such as out-of-plane motion or swallowing) may distort the error function appreciably so that it is difficult to quantify the rigid-body translation. However, even if the rigid-body translation could be quantified in this case, the data would still be corrupted with the other types of motion and a correction of just rigid-body translation would result in limited improvements.

Some embodiments may also compensate for observed data that is analyzed in a retrospective manner. In this case, even when the object's motion occurs over a single segment of data, two segment comparisons with correspondingly high measures of dispersion are observed. For example, in the second study in FIG. 5, where the subject swallowed during the acquisition of the $22^{nd}$ data segment (FIG. 5B), both the error functions at L=21 (comparing the $21^{st}$ and $22^{nd}$ data segments) and at L=22 (comparing the $22^{nd}$ and $23^{rd}$ data segments) show a large dispersion. Hence, object motion will typically result in two or more closely spaced peaks in the measure of error function dispersion. In this case, the motion corrupted segment is detected as the only segment with high dispersion on both adjacent comparisons. Segments that have a high dispersion in only one adjacent comparison are likely not corrupted by motion. Motions over longer periods of time can involve more segments and require a more complicated analysis to determine which lines are corrupted.

The proposed technique detects in which segment motion is likely to have occurred, but embodiments need not attempt to quantify the motion or discern the type. Additional information about the motion type can be discerned by analyzing individual coils. When two channel coils are utilized, the posterior receive coil is less sensitive to swallowing than the anterior receive coil (FIG. 6B) because motion in the neck due to swallowing is mostly limited to the anterior portion of the neck. Conversely, both receive coils appear to be equally sensitive to the rotation (FIG. 6C) since the entire image is affected by that type of motion. One point of interest is that the anterior element appears to detect the rotation one segment earlier than the posterior element (FIG. 6C). It is noted that while lying on a table, a rotation of the neck tends not to be rigid-body and the rotation is about a point in the posterior of the neck rather than the middle. As a result, the anterior part of the neck moves more than the posterior during the rotation and may therefore be detected as moving first.

In most imaging cases, the number of corrupted data segments is small and the corrupted lines can be reacquired, or can be recreated using parallel imaging techniques, a constrained reconstruction, or a variety of other methods which are suitable for compensating for motion. When segmented data is acquired in sets of adjacent lines in k-space (as it is often done in TSE and segmented GRE techniques), embodiments correlate data between sets to detect various types of motion. While in most cases the motion can not be fully quantified, the present methods provide a valuable and simple way to detect corrupted data so that it can be reacquired prospectively or removed from the data set retrospectively.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An imaging system comprising: data acquisition logic configured to receive raw image data; error detection logic configured to analyze correlation between a plurality of image scans within said raw image data and calculate an error function due to motion between said plurality of image scans; and a processor configured to determine, based on said error function, whether corrupt data is present in a particular image scan of said raw image data; and to instruct a transducer device to reacquire a new image scan of said particular image scan responsive to a determination that corrupt data is present in said particular image scan of raw image data.

2. The imaging system of claim 1, wherein said transducer is configured to receive raw image data from a subject.

3. The imaging system of claim 2 wherein said transducer is a magnetic resonance imaging (MRI) device.

4. The imaging system of claim 1 wherein said plurality of image scans are adjacent lines in k-space.

5. The imaging system of claim 4 wherein said plurality of image scans are directly adjacent.

6. The imaging system of claim 1 wherein said processing device is further configured to compensate for corrupt data present in another particular image scan of said raw image data by utilizing parallel imaging processing.

7. The imaging system of claim 1 wherein said processing device is further configured to compensate for corrupt data present in another particular image scan of said raw image data by utilizing constrained reconstruction processing.

8. The imaging system of claim 1 wherein a motion corrupted scan is detected as the only scan with a high error dispersion on comparisons which are adjacent to both sides of said corrupted scan.

9. A method to compensate for motion of a subject being imaged, said method comprising: receiving image acquisition data; analyzing correlation information of said image acquisition data between a plurality of points in k-space; calculating an error function due to motion corresponding to said correlation information; determining, based at least on said error function, whether new image acquisition data is needed for a particular point in k-space; receiving new image acquisition data for said particular point in k-space, wherein the new image acquisition data is received at least from a new scanning of a particular portion of the subject; and reconstructing an image using said new image acquisition data.

10. The method of claim 9 wherein said image acquisition data is received from a magnetic resonance imaging (MRI) device.

11. The method of claim 10 wherein calculating said error functions further comprises compensating for coil sensitivity of said MRI device.

12. The method of claim 9 further comprising correlating said subject motion with said error function.

13. The method of claim 9 further comprising analyzing correlation information of said new image acquisition data and calculating an error function corresponding to said correlation information.

14. The method of claim 9 wherein said image acquisition data is received from multiple channels and said error function is calculated using information from each independent channel.

15. A computer program product having a non-transitory computer readable media including instructions encoded thereon that, when executed, causes a processor to perform the operations of: receiving raw image data in k-space which includes a plurality of sequences, wherein at least one of said sequences are corrupted by motion of a portion of a subject being imaged; analyzing a correlation between said at least one corrupted sequence and an adjacent sequence of said plurality of sequences; calculating an error function corresponding to said correlation; acquiring additional sequence data in k-space to replace at least one of said at least one corrupted sequence, wherein the additional sequence data is acquired from a new scanning of said portion of said subject that was involved in said motion; and generating a reconstructed image which includes said additional sequence data.

16. The computer program product of claim 15 wherein said received image data comprises imaging data from a modality selected from the group consisting of:
    a positron emission tomography (PET) imaging modality;
    a computed tomography (CT) imaging modality;
    a combined PET/CT imaging modality;
    a magnetic resonance imaging (MRI) imaging modality;
    a radio frequency (RF) imaging modality;
    a millimeter wave imaging modality;
    a holographic imaging modality; and
    a nuclear medicine imaging modality.

17. The computer program product of claim 15 wherein said generated reconstructed image compensates for a global shift of the aliased error function corresponding to in-plane rigid-body translation.

18. The computer program product of claim 15 wherein said generated reconstructed image compensates for said motion because said error function is not characterized as minimal, while other types of motion which have an error function that is characterized as minimal are not corrected.

19. The computer program product of claim 15 further comprising instructions that, when executed, enables a processor to perform the operation of compensating for coil sensitivity of an MRI device.

20. The computer program product of claim 15 wherein said plurality of sequences is received from multiple channels and said error function is calculated using information from each independent channel.

21. The computer program product of claim 20 wherein information from multiple channels correspond to a single sequence and said information is averaged prior to calculating said error function.

22. The computer program product of claim 15 further comprising instructions that, when executed, enables a processor to perform the operation of retrospectively compensating for an observed corrupt sequence.

* * * * *

UNITED STATES PATENT AND TRADEMARK OFFICE
CERTIFICATE OF CORRECTION

PATENT NO. : 8,811,694 B2  
APPLICATION NO. : 12/895434  
DATED : August 19, 2014  
INVENTOR(S) : Jason K. Mendes et al.

Page 1 of 1

It is certified that error appears in the above-identified patent and that said Letters Patent is hereby corrected as shown below:

In the Specification

At column 8, line number 12, equation 4, "delete $\epsilon(x,y,t)$" and replace with --$\varepsilon(x,y,t)$--.

At column 8, line number 28, delete "$\epsilon(x,y,t)$" and replace with --$\varepsilon(x,y,t)$--.

At column 8, line number 31, delete "$\epsilon(x,y,t)$" and replace with --$\varepsilon(x,y,t)$--.

At column 8, line number 64, delete "TRITE" and replace with --TR/TE--.

Signed and Sealed this  
Twenty-first Day of October, 2014

Michelle K. Lee  
*Deputy Director of the United States Patent and Trademark Office*

UNITED STATES PATENT AND TRADEMARK OFFICE
CERTIFICATE OF CORRECTION

PATENT NO. : 8,811,694 B2
APPLICATION NO. : 12/895434
DATED : August 19, 2014
INVENTOR(S) : Jason K. Mendes et al.

It is certified that error appears in the above-identified patent and that said Letters Patent is hereby corrected as shown below:

In the Specification:

At column 1, line numbers 6-9, delete the following paragraph:

"This invention was made with government support under Grants HL48223 and HL57990, awarded by the National Institute of Health. The government has certain rights in this invention."

and insert the following paragraph:

--This invention was made with government support under grants R01 HL057990 and R01 HL048223 awarded by the National Institutes of Health. The government has certain rights in this invention.--

Signed and Sealed this
Fourteenth Day of June, 2016

Michelle K. Lee
*Director of the United States Patent and Trademark Office*